US010431579B2

(12) United States Patent
Yang et al.

(10) Patent No.: US 10,431,579 B2
(45) Date of Patent: Oct. 1, 2019

(54) DISPLAY PANEL INCLUDING ELECTROSTATIC PROTECTION CIRCUIT, DRIVING METHOD OF THE SAME, AND DISPLAY DEVICE

(71) Applicant: WuHan TianMa Micro-Electronics Co., Ltd., Wuhan (CN)

(72) Inventors: Xuan Yang, Wuhan (CN); Tao Peng, Wuhan (CN); Yingjie Chen, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/963,338

(22) Filed: Apr. 26, 2018

(65) Prior Publication Data
US 2019/0164954 A1 May 30, 2019

(30) Foreign Application Priority Data
Nov. 29, 2017 (CN) .......................... 2017 1 1224162

(51) Int. Cl.
*H01L 27/02* (2006.01)
*H01L 27/15* (2006.01)
*H01L 27/12* (2006.01)

(52) U.S. Cl.
CPC ...... *H01L 27/0292* (2013.01); *H01L 27/0255* (2013.01); *H01L 27/0266* (2013.01); *H01L 27/0296* (2013.01); *H01L 27/1244* (2013.01); *H01L 27/156* (2013.01); *G09G 2330/04* (2013.01)

(58) Field of Classification Search
CPC ............ H01L 27/0255; H01L 27/0292; H01L 27/0296
See application file for complete search history.

(56) References Cited

U.S. PATENT DOCUMENTS

| 10,269,788 | B2 * | 4/2019 | Cheng | H01L 27/0266 |
| 2007/0246778 | A1 * | 10/2007 | Liou | H01L 27/0266 257/362 |
| 2007/0268420 | A1 * | 11/2007 | Tsai | G02F 1/13452 349/40 |
| 2010/0155724 | A1 * | 6/2010 | Hong | H01L 23/60 257/48 |

(Continued)

*Primary Examiner* — Chun-Nan Lin
(74) *Attorney, Agent, or Firm* — Tarolli, Sundheim, Covell & Tummino LLP

(57) ABSTRACT

Provided are a display panel, a driving method, and a display device. The display panel comprises: pixel circuits arranged in rows and columns in a display area which comprises first and second display areas along a row direction, and an outer edge of the second display area extending stepwise along a column direction; data lines one-to-one corresponding to columns of the pixel circuit; signal line groups one-to-one corresponding to rows of the pixel circuits, each signal line group comprising a scan line and a light-emitting control signal line; and first electrostatic protection circuits one-to-one corresponding to data lines in the second display area, each first electrostatic protection circuit being connected to a scan line and a light-emitting control signal line in the same signal line group, for discharging static electricity on the data line to the scan line or the light-emitting control signal line.

20 Claims, 11 Drawing Sheets

(56) References Cited

U.S. PATENT DOCUMENTS

| | | | |
|---|---|---|---|
| 2015/0379927 A1* | 12/2015 | Cai | G09G 3/3233 345/214 |
| 2016/0098953 A1* | 4/2016 | Ko | G09G 3/3208 345/76 |
| 2018/0204829 A1* | 7/2018 | Cheng | H01L 27/0266 |

* cited by examiner

DISPLAY PANEL INCLUDING ELECTROSTATIC PROTECTION CIRCUIT, DRIVING METHOD OF THE SAME, AND DISPLAY DEVICE

CROSS-REFERENCE TO RELATED APPLICATIONS

The present application claims priority to Chinese Patent Application No. 201711224162.3, filed on Nov. 29, 2017, the content of which is incorporated herein by reference in its entirety.

TECHNICAL FIELD

The present disclosure relates to the field of display technologies and, particularly, relates to a display panel, a driving method of the display panel, and a display device.

BACKGROUND

During production of a display panel, the display panel may accumulate a large amount of static electricity which in turn causes discharge of static electricity, due to some foreign factors. During discharging of the static electricity, the large amount of electrostatic charge may be transported in a short time such that an extremely high electrostatic current may be generated, which not only influences the data signal transmitted through the data lines, but also in some serious cases causes breakdown of an semiconductor element. In order to overcome such problem, a plurality of electrostatic protection circuits is provided in the display panel. However, the electrostatic protection circuits need additional signal lines which occupy a large space in the non-display area, and in turn make the border of the corresponding part of the non-display area visually obvious, which is disadvantageous for achieving a narrow border.

SUMMARY

The present application provides a display panel, a driving method of the display panel, and a display device, which can achieve electrostatic protection of the display panel, and realize a narrower border.

In a first aspect, the embodiments of the present disclosure provide a display panel. The display panel includes: a plurality of pixel circuits arranged in a display area of the display panel, wherein the plurality of pixel circuits is arranged in columns and rows, the display area includes a first display area and a second display area arranged along a row direction, and an outer edge of the second display area extends stepwise along a column direction; a plurality of data lines each extending along the column direction, wherein the plurality of data lines corresponds to a plurality of columns of the plurality of pixel circuits in one-to-one correspondence; a plurality of signal line groups, wherein the plurality of signal line groups corresponds to a plurality of rows the plurality of pixel circuits in one-to-one correspondence, and each of the plurality of signal line groups includes a scan line and a light-emitting control signal line each extending along the row direction; and a plurality of first electrostatic protection circuits, wherein the plurality of first electrostatic protection circuits corresponds to data lines in the second display area in one-to-one correspondence, each of the plurality of first electrostatic protection circuits is connected to a scan line and a light-emitting control signal line of a same signal line group, and each of the plurality of first electrostatic protection circuits is used to discharge static electricity on a data line connected to the first electrostatic protection circuit to a scan line or a light-emitting control signal line connected to the first electrostatic protection circuit.

In a second aspect, embodiments of the present disclosure provide a driving method of a display panel, applicable in the display panel of the first aspect. The driving method includes: in a light emission preparation period, providing, by the scan line, a first scan signal, and writing, by each of the plurality of data lines, a data signal into pixel circuits of a corresponding column of the plurality of pixel circuits; and in a light emitting period, providing, by the light-emitting control signal line, a light-emitting control signal which drives pixels in a corresponding row to emit light while driving a first electrostatic protection circuit connected to the light-emitting control signal line to work, so that the first electrostatic protection circuit controls static electricity on the data line connected to the first electrostatic protection circuit to be discharged to the scan line or the light-emitting control signal line connected to the first electrostatic protection circuit.

In a third aspect, embodiments of the present disclosure provide a display device. The display device includes the display panel the first aspect.

BRIEF DESCRIPTION OF DRAWINGS

In order to more clearly illustrate the technical solutions of the embodiments of the present disclosure, the accompanying drawings used for describing the embodiments are introduced simply as follows. These drawings are merely a part of the embodiments of the present disclosure, based on which those skilled in the art can still derive other drawings without paying any creative effort.

DESCRIPTION OF EMBODIMENTS

In order to better understand the technical solutions of the present disclosure, the embodiments of the present disclosure are illustrated in details below with reference to the accompanying drawings.

It should be noted that the described embodiments are merely a part of the embodiments of the present disclosure rather than all of the embodiments. Based on the described embodiments, all other embodiments obtained by those skilled in the art without paying any creative work shall fall into the protection scope of the present disclosure.

The terms used in the embodiments of the present disclosure are merely intended for describing specific embodiments, rather than limiting the present disclosure. The terms "a", "an", and "the" in a singular form in the embodiments and the appended claims are also intended to include the plural forms thereof, unless otherwise noted.

It should be understood that the term "and/or" used in the context is merely intended to describe a relationship of the correlated objects, that is, representing three types of relations, for example, "A and/or B" may represent: only A, both A and B, or only B. Besides, the symbol "/" used in the context generally represents "or" relation of the correlated objects.

Although terms such as first, second, and third may be used in the embodiments to describe the display area, the display areas are not limited to these terms. These terms are merely used to distinguish the display areas from one another. For example, without departing from the scope of the embodiments of the present disclosure, a first display area may be referred to as a second display area, and, similarly, the second display area may be referred to as the first display area.

Figure 1:
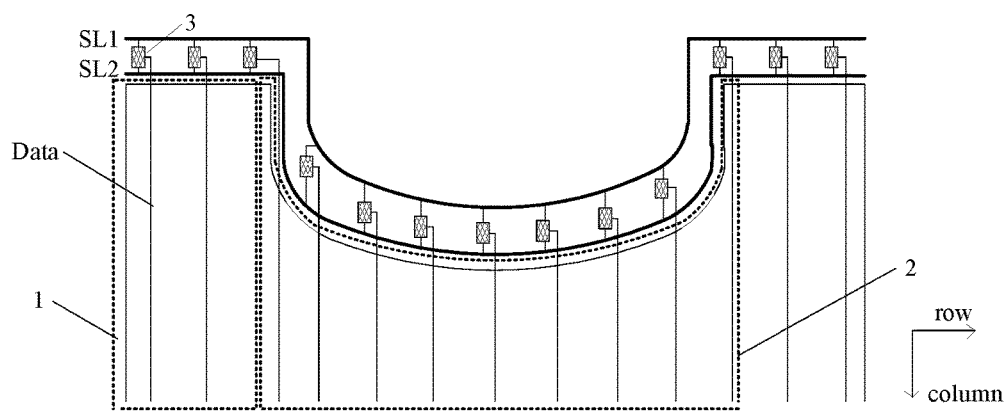
FIG. 1 schematically illustrates a top view of a display panel in the related art.

At present, a special-shaped display panel has been applied more and more widely. The display panel generally includes a display area and a non-display area. Taking the display panel shown in FIG. 1 for example, a plurality of data lines Data is arranged in rows and columns in the display area, the display area of the display panel includes a first display area 1 and a second display area 2 along a row direction, and an outer edge of the second display area 2 is bent in a column direction.

During production of the display panel, the display panel may accumulate a large amount of static electricity which in turn causes discharge of static electricity, due to some foreign factors. During discharging of the static electricity, the large amount of electrostatic charge may be transported in a short time such that an extremely high electrostatic current may be generated, which not only influences the data signal transmitted through the data lines, but also in some serious cases causes breakdown of an semiconductor element. In order to overcome such problem, further with reference to FIG. 1, a plurality of electrostatic protection circuits 3 connected to the plurality of data lines Data in one-to-one correspondence, a first signal line SL1 used for providing a high level signal, and a second signal line SL2 used for providing a low level signal are additionally provided in the non-display area. Each of the electrostatic protection circuits 3 is connected to the first signal line SL1 and the second signal line SL2 so that the electrostatic current can be released through the first signal line SL1 or the second signal line SL2 during electrostatic discharging.

However, based on the second display area 2 having a curved outer edge, when arranging the first signal line SL1 and the second signal line SL2, the part of the first signal line SL1 and the part of the second signal line SL2 in the non-display area corresponding to the second display area 2 need to be bent towards the outer edge of the second display area 2, i.e., set in a surrounding manner. Accordingly, the first signal line SL1 and the second signal line SL2 occupy a relatively large space in the part of the non-display area, which therefore causes the border corresponding to the part of the non-display area visually obvious, which is disadvantage for achieving a narrow border.

Figure 2:
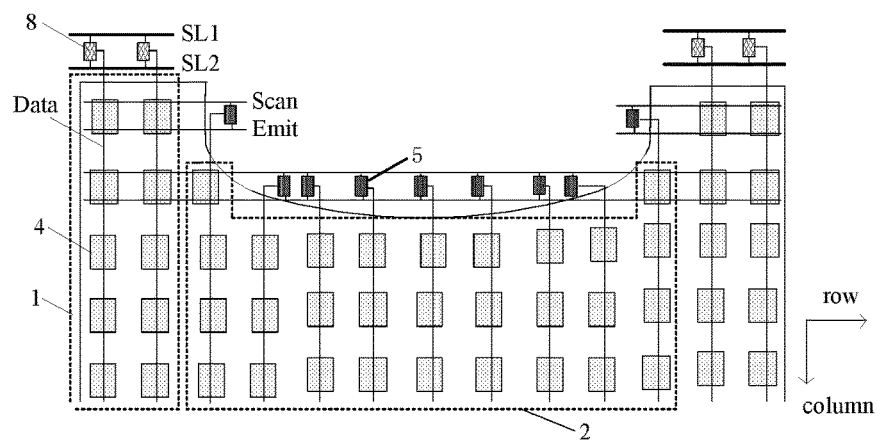
FIG. 2 schematically illustrates a top view of a display panel according to an embodiment of the present disclosure.

An embodiment of the present disclosure provides a display panel. As shown in FIG. 2, the display panel includes a plurality of pixel circuits 4 arranged in rows and columns, a plurality of data lines Data, a plurality of signal line groups, and a plurality of first electrostatic protection circuits 5. The display panel includes a display area and a non-display area. The display area of the display panel includes a first display area 1 and a second display area 2 along a row direction. An outer edge of the second display area 2 extends stepwise along a column direction.

The plurality of data lines Data each extends along the column direction, and the plurality of data lines Data corresponds to columns of the plurality of pixel circuits 4 in one-to-one correspondence. The plurality of signal line groups corresponds to rows of the plurality of pixel circuits 4 in one-to-one correspondence, and each signal line group includes a scan line Scan and a light-emitting control signal line Emit. Each of the scan line Scan and the light-emitting control signal line Emit extends along the row direction. The plurality of first electrostatic protection circuits 5 corresponds to data lines Data in the second display area 2 in one-to-one correspondence, and each first electrostatic protection circuit 5 is connected to both a scan line Scan and a light-emitting control signal line Emit in a same signal line group. Each of the plurality of first electrostatic protection circuits 5 is used to release static electricity on a data line Data connected to the first electrostatic protection circuit 5 to a scan line Scan or a light-emitting control signal line Emit connected to the first electrostatic protection circuits 5.

It is understandable that the scan line Scan is a signal line for providing a scan signal to pixel circuits 4 of a corresponding row, the light-emitting control signal line Emit is a signal line for providing a light-emitting signal to pixel circuits 4 of a corresponding row, and both the scan line Scan and the light-emitting control signal line Emit are original signal lines in the display panel.

In the display panel provided in the present embodiment, as for the first electrostatic protection circuits 5 connected to the data lines Data in the second display area 2, each first electrostatic protection circuit 5 is connected to the original scan line Scan and the original light-emitting control signal line Emit of the display panel. Thus, when the static electricity on the data lines Data in the second display area 2 is being discharged, the static electricity can be discharged through the scan line Scan or the light-emitting control signal line Emit. That is to say, by using the display panel of the present embodiment, the original scan line Scan or the original light-emitting control signal line Emit of the display panel can be used as a path for discharging the static electricity on the data lines Data in the second display area 2, and it is unnecessary to provide additional discharging path for the first electrostatic protection circuit 5, i.e., the first signal line and the second signal line in the related art are unnecessary to be provided for the data lines Data in the second display area 2. In this manner, there is no need to provide the first signal line and the second signal line in a winding manner in the non-display area corresponding to the second display area 2. Therefore, the space is saved to a certain extent, and the border of the display panel corresponding to the second display area 2 can be formed narrower.

Based on the above structure, when static electricity causes that a potential of a data signal on the data line Data in the second display area 2 is excessively high or excessive low, the static electricity on the data line Data can be discharged by the first electrostatic protection circuit 5 connected thereto through the corresponding scan line Scan or the corresponding light-emitting control signal line Emit, so that the data signal on the data line Data returns to normal, and thus the display panel displays normally, thereby avoiding the problem of non-uniform brightness of images due to unstable data signals.

Further with reference to FIG. 2, in order to achieve electrostatic protection of all of the data lines Data in the display area, the display panel may further include a first signal line SL1 for providing a high level signal, a second signal line SL2 for providing a low level signal, and a plurality of second electrostatic protection circuits 8. The first signal line SL1 and the second signal line SL2 are located in a portion of the non-display area corresponding to the first display area 1. The plurality of second electrostatic protection circuits 8 corresponds to data lines Data in the first display area 1 in one-to-one correspondence, and each second electrostatic protection circuit 8 is connected to both the first signal line SL1 and the second signal line SL2. When the static electricity causes that a potential of a data signal on the data line Data in the first display area 1 is excessively high or excessively low, the static electricity on the data line Data can be discharged by the second electrostatic protection circuit 8 connected thereto through the first signal line SL1 and the second signal line SL2, and thus the data signal on the data line Data can return to normal.

Figure 3:
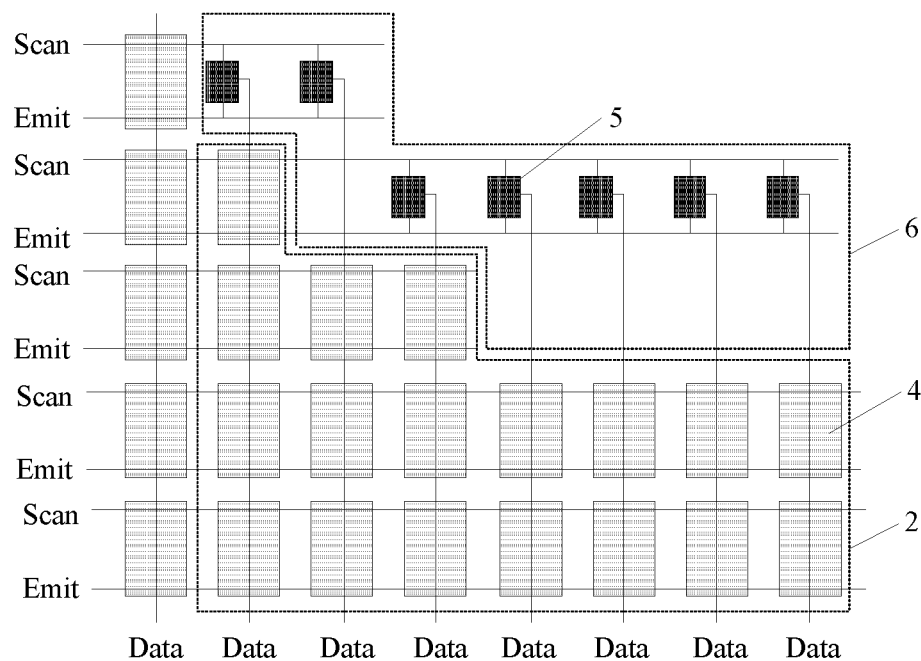
FIG. 3 illustrates a first partially exploded diagram of a display panel according to an embodiment of the present disclosure.

As shown in FIG. 3, the first electrostatic protection circuits 5 may be located in a first non-display area 6, and the first non-display area 6 is a non-display area corresponding to a stepwise area of the second display area 2.

The first pixel circuit in a $y^{th}$ column of the plurality of pixel circuits is located in an $x^{th}$ row of the plurality of pixel circuits, a data line Data corresponding to the $y^{th}$ column is connected to one of the plurality of first electrostatic protection circuits 5, the first electrostatic protection circuit 5 is further connected to a scan line Scan and a light-emitting control signal line Emit corresponding to any row of first to $(x-1)^{th}$ rows of the plurality of pixel circuits, and the pixel circuits in the first to $(x-1)^{th}$ rows are at a side of the $x^{th}$ row close to the stepwise area, wherein x is a positive integer greater than 2, and y is a positive integer greater than or equal to 1.

For example, assuming that the fourth column of pixel circuits shown in FIG. 3 is the $y^{th}$ column of pixel circuits in the display area, the third row of pixel circuits shown in FIG. 3 is the $x^{th}$ row of pixel circuits in the display area, and the second row of pixel circuits shown in FIG. 3 is the $(x-1)^{th}$ row of pixel circuits in the display area.

Based on the number of rows and columns of the pixel circuits in FIG. 3, taking the first electrostatic protection circuit connected to the data line Data in the second column and the first electrostatic protection circuit connected to the data line Data in the third column as an example, each of these two first electrostatic protection circuits is connected to the scan line Scan and the light-emitting control signal line Emit corresponding to the first row of pixel circuit. In this manner, a space occupied by these two first electrostatic protection circuits in the first non-display area 6 merely amounts to a space occupied by two extra pixel circuits, which saves the space to a great extent, compared with the manner in the related art that the first signal line and second signal line are provided in a winding manner in the first non-display area 6.

Figure 4:
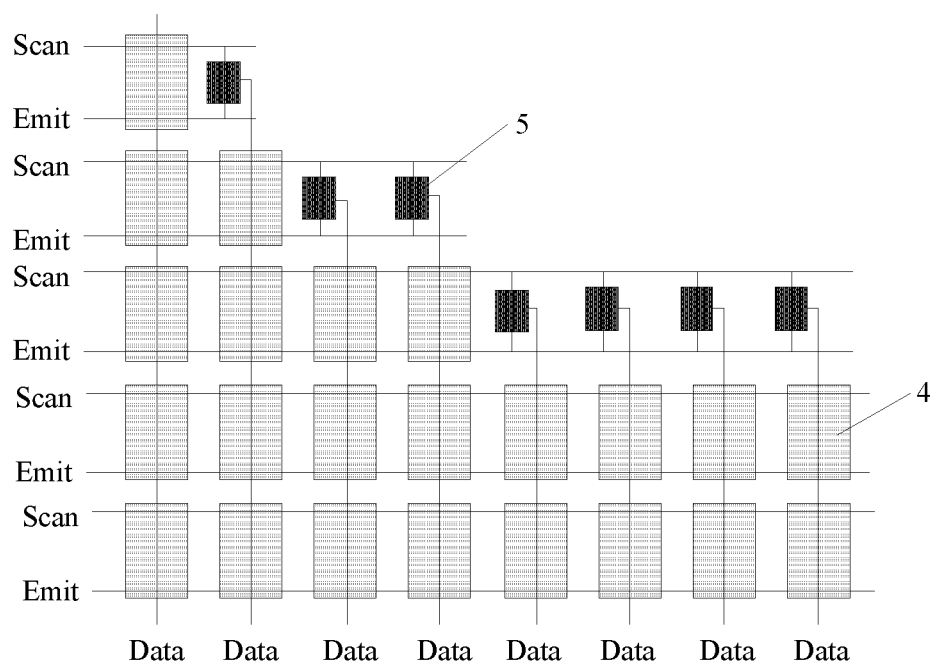
FIG. 4 illustrates a second partially exploded diagram of a display panel according to an embodiment of the present disclosure

In an embodiment shown in FIG. 4, the first electrostatic protection circuit connected to the data line Data corresponding to the $y^{th}$ column of pixel circuits is connected to the scan line Scan and the light-emitting control signal line Emit corresponding to the $(x-1)^{th}$ row of pixel circuits.

By using the manner for setting the first electrostatic protection circuits shown in FIG. 4, it is achieved that the first electrostatic protection circuits 5 are arranged at an edge of the second display area 2 so that the first electrostatic protection circuits 5 can be arranged in a more compact and concentrated manner. Compared with the setting manner shown in FIG. 3, the setting manner in FIG. 4 can reduce an overall spaced occupied by the first electrostatic protection circuits 5 in the first non-display area 6, which in turn can reduce a width of the border of the display panel corresponding to the first non-display area 6.

Figure 5:
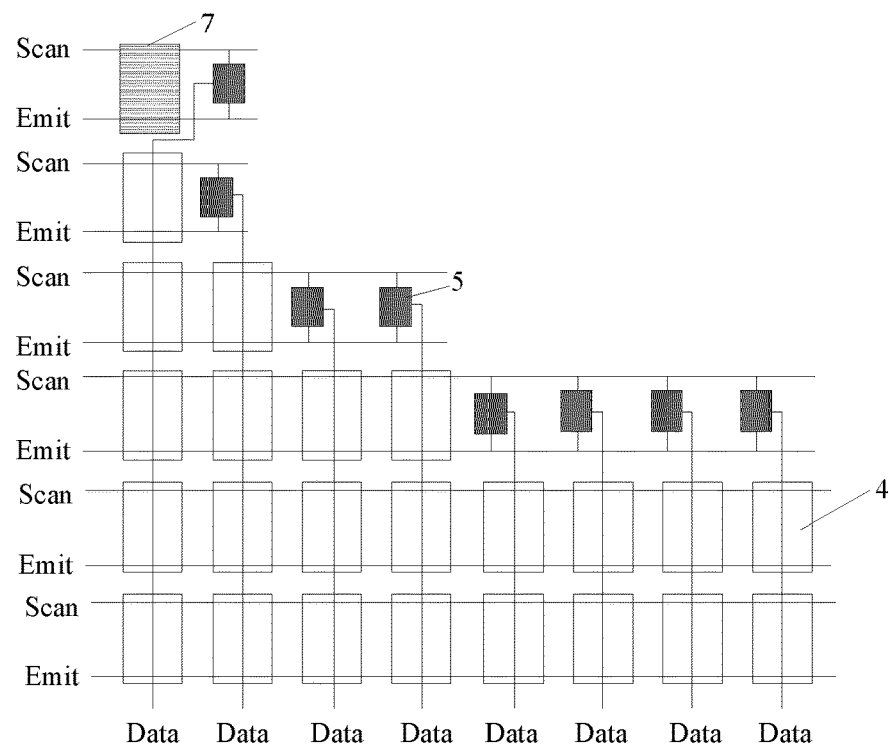
FIG. 5 illustrates a third partially exploded diagram of a display panel according to an embodiment of the present disclosure.

In addition, as shown in FIG. 5, when the first pixel circuit in the $i^{th}$ column of pixel circuits is located in the first row, the display panel further includes a dummy pixel circuit 7 at a side of the first row of pixel circuits away from the second row of pixel circuits, and the dummy pixel circuit 7 corresponds to one scan line Scan and one light-emitting control signal line Emit. In this situation, the display panel further includes a first electrostatic protection circuit which is connected to the data line Data corresponding to the $i^{th}$ column of pixel circuits, and is also connected to both the scan line Scan and the light-emitting control signal line Emit corresponding to the dummy pixel circuit 7, wherein i is a positive integer greater than or equal to 1.

For example, assuming that the first column of pixel circuits in FIG. 5 is the $i^{th}$ column of pixel circuits in the display area, the first row of pixel circuits in FIG. 5 is the first row of pixel circuits in the display area, and the second row of pixel circuits in FIG. 5 is the second row of pixel circuits in the display area.

After the dummy pixel circuit 7 is provided in the display panel, the first electrostatic protection circuit connected to the data line Data corresponding to the $i^{th}$ column of pixel circuits may be connected to the scan line Scan and light-emitting control signal line Emit corresponding to the dummy pixel circuit 7. Therefore, there is no need to provide the first signal line and the second signal line in a portion of the non-display area corresponding to a portion of the display area where the $i^{th}$ column of pixel circuits is located, which further reduces the space that may be occupied by the first signal line and the second signal line.

When the first pixel circuit of each of the columns of pixel circuits in the display panel is located in the first row, for example, when the first pixel circuit in each of the columns of pixel circuits in the first display area 1 is located in the first row, the dummy pixel circuit 7 can be similarly provided at a side of the first row of pixel circuits away from the second row of pixel circuits. Correspondingly, the display panel further includes a plurality of first electrostatic protection circuits 5 which one-to-one corresponds to the data lines Data corresponding to the columns of pixel circuits in the first display area 1, each of these first electrostatic protection circuits 5 is connected to the scan line Scan and light-emitting control signal line Emit corresponding to the dummy pixel circuit 7. As such, it is unnecessary to provide the first signal line and the second signal line in the display panel, which reduces the width of the border corresponding to the first non-display area 6 while further reducing a width of a border of a portion of the non-display area corresponding to the first display area 1, thereby reducing the width of the entire border of the display device.

The first electrostatic protection circuit 5 may include a first thin film transistor, a first diode, and a second diode. The first thin film transistor is of the same type as the thin film transistor in the pixel circuits 4. A first electrode of the first diode is connected to a first electrode of the first thin film transistor, and a second electrode of the first diode is connected to the corresponding scan line Scan; a second electrode of the second diode is connected to both a second electrode of the first thin film transistor and the corresponding data line, and a first electrode of the second diode is connected to both a gate electrode of the first thin film transistor and the corresponding light-emitting control signal line Emit.

In an embodiment, when the first thin film transistor and the thin film transistors in the pixel circuits are all P-type thin film transistors, the first electrode of the first diode is a positive electrode, the second electrode of the first diode is a negative electrode, the first electrode of the second diode is a positive electrode, and the second electrode of the second diode is a negative electrode.

Figure 6:
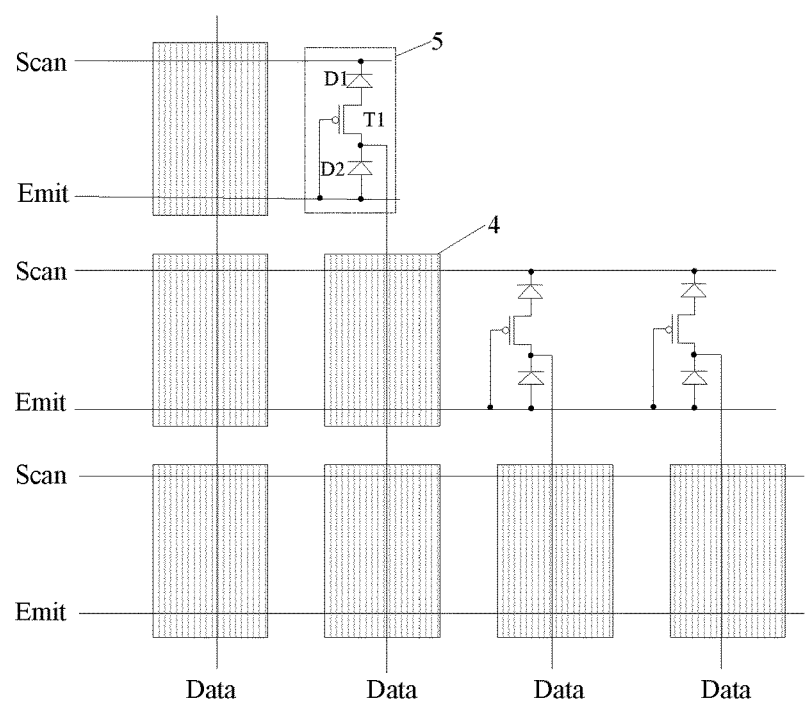
FIG. 6 illustrates a first structural schematic diagram of a first electrostatic protection circuit according to an embodiment of the present disclosure.

As shown in FIG. 6, when the first thin film transistor T1 is a P-type thin film transistor, the positive electrode of the first diode D1 is connected to the first electrode of the first thin film transistor T1, the negative electrode of the first diode D1 is connected to the corresponding scan line Scan, the negative electrode of the second diode D2 is connected to both the second electrode of the first thin film transistor T1 and the corresponding data line Data, the positive electrode of the second diode D2 is connected to both the gate electrode of the first thin film transistor T1 and the corresponding light-emitting control signal line Emit.

Taking a pixel circuit "7T1C" shown in FIG. 7 for example, a driving process of the display panel and working principles of the first electrostatic protection circuit are illustrated in details as follows in combination of a signal sequence diagram shown in FIG. 8:

The pixel circuit includes a capacitor C and fifth to eleventh thin film transistors T5-T11, both a gate electrode of the ninth thin film transistor T9 and a gate electrode of the eleventh thin film transistor T11 are connected to a first scan line Scan1, both a gate electrode of the sixth thin film transistor T6 and a gate electrode of the eighth thin film transistor T8 are connected to a second scan line Scan 2, and both a gate electrode of the fifth thin film transistor T5 and a gate electrode of the tenth thin film transistor T10 are connected to a light-emitting control signal line Emit. A first electrode of the fifth thin film transistor T5 is connected to a power source voltage signal line PVDD, a first electrode of the sixth thin film transistor T6 is connected to a data line Data, and both a first electrode of the ninth thin film transistor T9 and a first electrode of the eleventh thin film transistor T11 are connected to a reference voltage line Vref.

In the embodiments of the present disclosure, the scan line Scan connected to the first electrostatic protection circuit 5 may be the first scan line Scan1 or the second scan line Scan2. The following description is presented based on an instance in which the scan line Scan is the second scan line Scan2.

Within one frame time, a drive period of one pixel circuit includes an initialization period t1, a data writing period t2, and a light emitting period t3.

During the initialization period t1, the second scan line Scan2 and the light-emitting control signal line Emit respectively provide a high level signal (for understanding convenience, in FIG. 8, "Scan1" corresponds to a signal provided by the first scan line Scan1, "Scan2" corresponds to a signal provided by the second scan line Scan2, and "Emit" corresponds to a signal provided by the light-emitting control signal line Emit) and the first scan line Scan1 provides a low level signal so that the ninth thin film transistor T9 and the eleventh thin film transistor T11 are turned on, and the reference voltage line Vref provides a reference voltage signal so that the anode of the light-emitting diode D is reset. In this period, the first thin film transistor T1 of the first electrostatic protection circuit 5 is turned off under the action of the high level signal provided by the light-emitting control signal line Emit, and at this time, the data line Data is cut off from the second scan line Scan2.

During the data writing period t2, the first scan line Scan1 and light-emitting control signal line Emit respectively provide a high level signal, and the second scan line Scan2 provides a first scan signal of a low level, so that the sixth thin film transistor T6 and the eighth thin film transistor T8 are turned on and the data line Data writes data signal. In this period, the first thin film transistor T1 of the first electrostatic protection circuit 5 is turned off under the action of the high level signal provided by the light-emitting control signal line Emit, and, at this time, the data line Data is cut off from the second scan line Scan2.

It should be noted that, if the first electrostatic protection circuit 5 does not includes the first thin film transistor T1 in the data writing period t2, the second scan line Scan2 provides a first scan signal of a low level and the light-emitting control signal line Emit provides a high level signal, and therefore, the first diode D1 and the second diode D2 are turned on and the second scan line Scan 2 is directly connected to the light-emitting control signal line Emit, which causes competition of signals, thus influences the writing of data signal, and further influences the normal light emission of the light-emitting diode D. However, after the first thin film transistor T1 is included in the first electrostatic protection circuit 5 in the data writing period t2, the first thin film transistor T1 will be turned off under an action of the high level signal provided by the light-emitting control signal line Emit so that the second scan line Scan2 is cut off from the light-emitting control signal line Emit, thereby ensuring normal writing of the data signal.

During the light emitting period t3, the first scan line Scan1 and second scan line Scan2 respectively provide a high level signal and the light-emitting control signal line Emit provides a low level light-emitting control signal so that the fifth thin film transistor T5 and the tenth thin film transistor T10 are turned on, and a data signal is transmitted to the light-emitting diode D via the tenth thin film transistor T10 and drives the light-emitting diode D to emit light. During this period, the first thin film transistor T1 of the first electrostatic protection circuit 5 is turned on under an action of the low level light-emitting control signal provided by the light-emitting control signal line Emit, and the first electrostatic protection circuit 5 starts to work.

During working of the first electrostatic protection circuit 5, when a potential of the data signal transmitted through the data line Data is greater than a potential of a high level signal provided by the second scan line Scan2, the first diode D1 will be turned on, and static electricity on the data line Data will be discharged through the second scan line Scan2 until the potential of the data signal equals to the potential of the high level signal provided by the second scan line Scan2. When the potential of the data signal transmitted through the data line Data is smaller than the potential of the low level light-emitting control signal provided by the light-emitting control signal line Emit, the second diode D2 is turned on, and static electricity on the data line Data is discharged through the light-emitting control signal line Emit until the potential of the data signal equals to the potential of the low level signal provided by the light-emitting control signal line Emit. Since the static electricity on the data line Data is discharged through the second scan line Scan2 or the light-emitting control signal line Emit, the problem of non-uniform brightness of images due to unstable data signal is avoided and the display panel can display normal images.

It should be noted that, when the scan line Scan connected to the first electrostatic protection circuit 5 is the first scan line Scan1, the first scan line Scan1 similarly provides a high level signal, which similarly drives the first electrostatic protection circuit 5 to work during the light emitting period t3.

In an embodiment, when the first thin film transistor and the thin film transistors in the pixel circuits are all N-type thin film transistors, the first electrode of the first diode is a negative electrode, the second electrode of the first diode is a positive electrode, the first electrode of the second diode is a negative electrode, and the second electrode of the second diode is a positive electrode.

Figure 9:
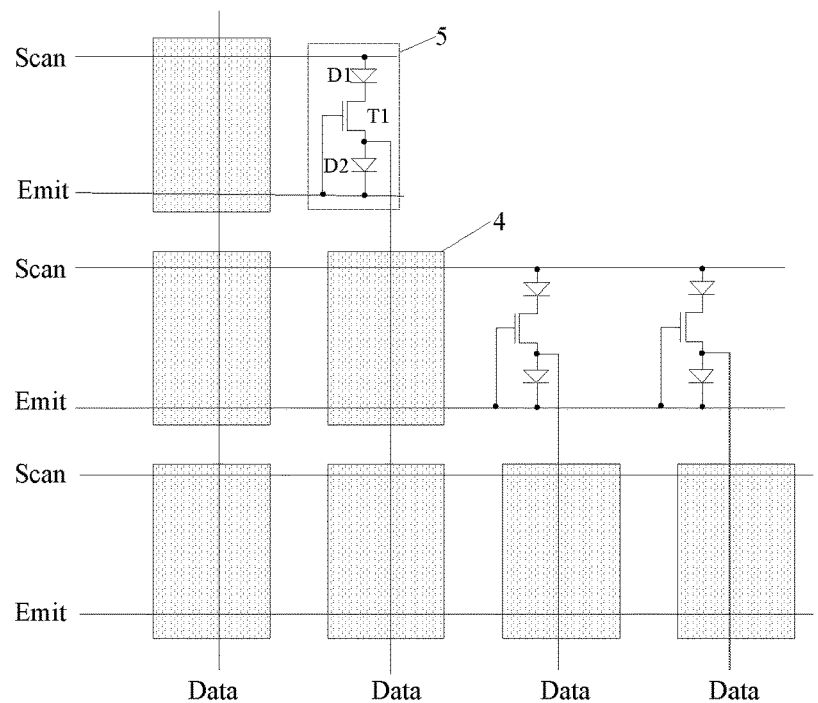
FIG. 9 illustrates a second structural schematic diagram of a first electrostatic protection circuit according to an embodiment of the present disclosure.

As shown in FIG. 9, when the first thin film transistor T1 is a N-type thin film transistor, the negative electrode of the first diode D1 is connected to the first electrode of the first thin film transistor T1, the positive electrode of the first diode D1 is connected to the corresponding scan line Scan, the positive electrode of the second diode D2 is connected to both the second electrode of the first thin film transistor T1 and the corresponding data line Data, the negative electrode of the second diode D2 is connected to both the gate electrode of the first thin film transistor T1 and the corresponding light-emitting control signal line Emit.

Figure 7:
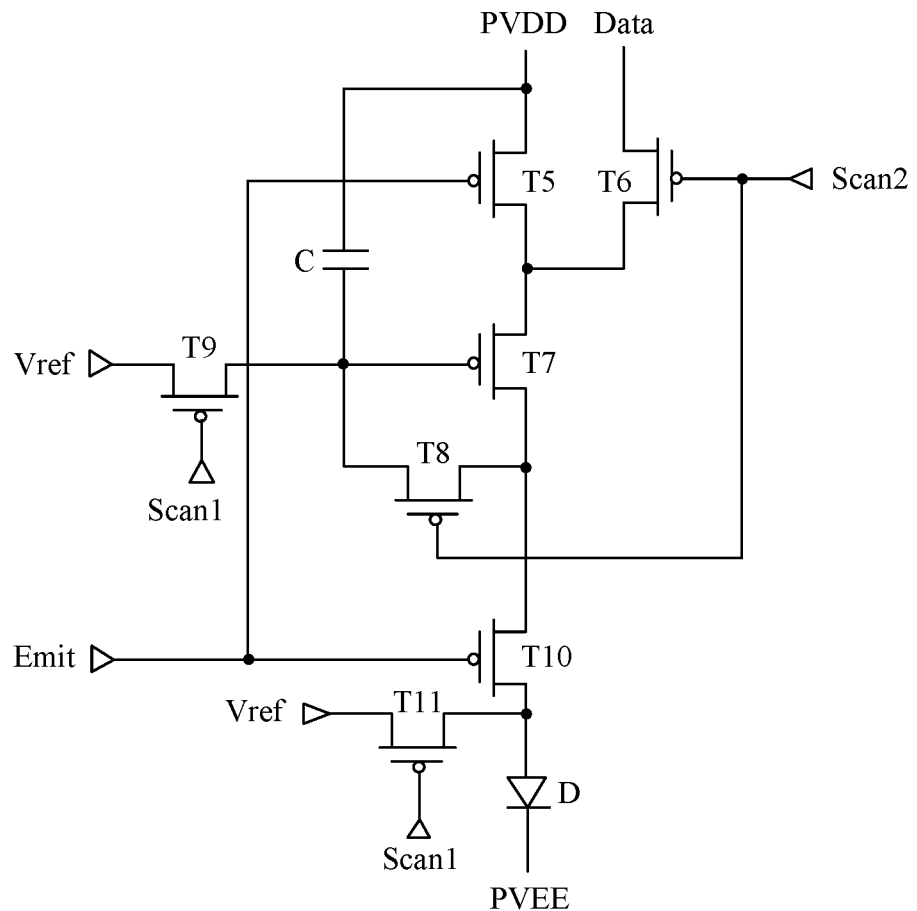
FIG. 7 illustrates a structural schematic diagram of a pixel circuit according to an embodiment of the present disclosure.

When the first thin film transistor T1 and the thin film transistors in the pixel circuits are all N-type thin film transistors, the driving process of the pixel circuits is similar to the driving process of the pixel circuits shown in FIG. 7, and the difference lies in that, during each period, the signals provided by the first scan line Scan1, the second scan line Scan2, and light-emitting control signal line Emit has opposite level to those shown in FIG. 7, which is not repeated herein.

During the light emitting period t3, during working of the first electrostatic protection circuit 5, when the potential of the data signal transmitted through the data line Data is greater than the potential of the high level light-emitting control signal provided by the light-emitting control signal line Emit, the second diode D2 is turned on, and the static electricity on the data line Data is discharged through the light-emitting control signal line Emit until the potential of the data signal equals to the potential of the high level signal of the light-emitting control signal line Emit. When the potential of the data signal transmitted through the data line Data is smaller than the potential of the low level signal provided by the second scan line Scan2, the first diode D1 is turned on, and the static electricity on the data line Data is discharged through the second scan line Scan2 until the potential of the data signal equals to the potential of the low level signal provided by the second scan line Scan2. Since the static electricity on the data line Data is discharged through the light-emitting control signal line Emit or the second scan line Scan2, the problem of non-uniform brightness of images due to unstable data signal is avoided and the display panel can display normal images.

It should be noted that, when the scan line Scan connected to the first electrostatic protection circuit 5 is the first scan line Scan1, during the light emitting period t3, the first scan line Scan1 similarly provides a low level signal which similarly drives the first electrostatic protection circuit 5 to work in this period.

Besides, in order to achieve connection between the data line Data and the first electrostatic protection circuit 5, the data line Data may be connected to the first electrode of the thin film transistor, in addition to that the data line Data is connected to the second electrode of thin film transistor in the first electrostatic protection circuit 5.

The first electrostatic protection circuit 5 may include a second thin film transistor, a third diode, and a fourth diode. The second thin film transistor is of the same type as the thin film transistors in the pixel circuits 4. A first electrode of the third diode is connected to both a first electrode of the second thin film transistor and the corresponding data line Data, a second electrode of the third diode is connected to the scan line Scan, a second electrode of the fourth diode is connected to a second electrode of the second thin film transistor, and a first electrode of the fourth diode is connected to both a gate electrode of the second thin film transistor and the corresponding light-emitting control signal line Emit.

In an embodiment, when the second thin film transistor and the thin film transistors in the pixel circuits 4 are all P-type thin film transistors, the first electrode of the third diode is a positive electrode, the second electrode of the third diode is a negative electrode, and a first electrode of the fourth diode is a positive electrode, and the second electrode of the fourth diode is a negative electrode.

Figure 10:
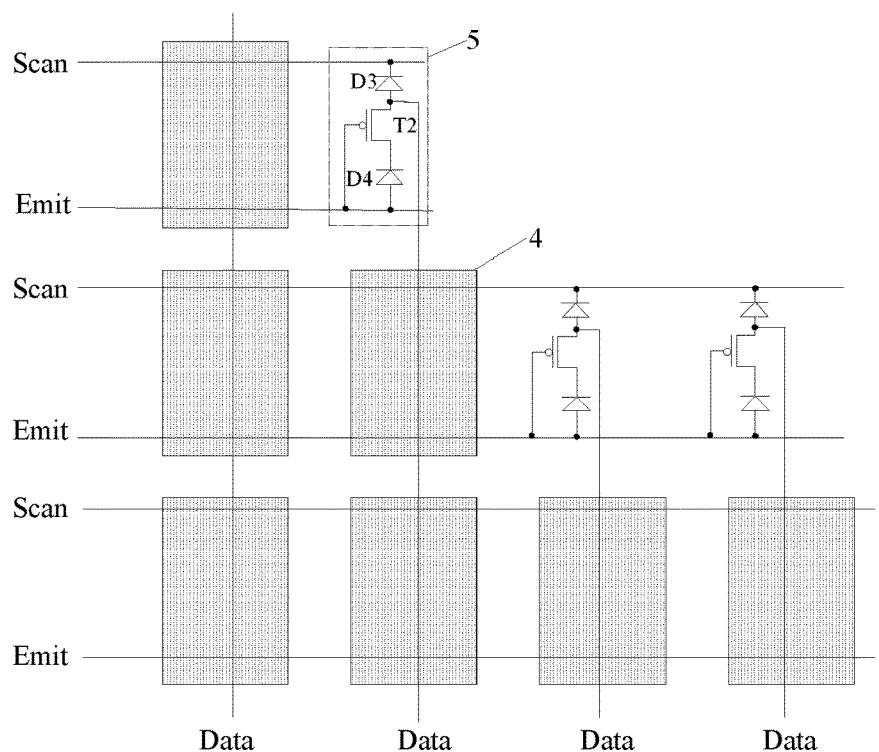
FIG. 10 illustrates a third structural schematic diagram of a first electrostatic protection circuit according to an embodiment of the present disclosure.

As shown in FIG. 10, when the second thin film transistor T2 is a P-type thin film transistor, the positive electrode of the third diode D3 is connected to both the first electrode of the second thin film transistor T2 and the corresponding data line Data, the negative electrode of the third diode D3 is connected to the corresponding scan line Scan, the negative electrode of the fourth diode D4 is connected to the second electrode of the second thin film transistor T2, and the positive electrode of the fourth diode D4 is connected to both the gate electrode of the second thin film transistor T2 and the corresponding light-emitting control signal line Emit.

Figure 8:
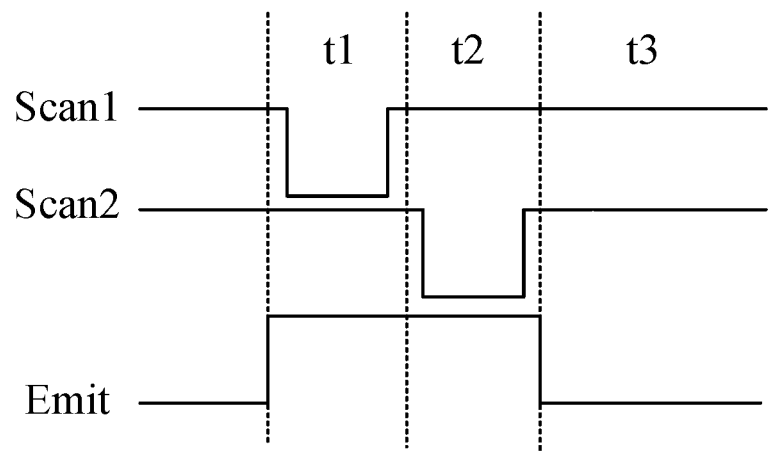
FIG. 8 is a signal sequence diagram of a pixel circuit according to an embodiment of the present disclosure.

When the second thin film transistor T2 and the thin film transistors in the pixel circuits 4 are all P-type thin film transistors, the driving process of the pixel circuits and the working principles of the first electrostatic protection circuits 5 are similar to those shown in FIGS. 6-8, which are not repeated herein.

It should be noted that, during the data writing period t2, if the first electrostatic protection circuit 5 does not include the second thin film transistor T2, the second scan line Scan2 will provide a first scan signal of a low level and the light-emitting control signal line Emit will provide a high level signal so that the third diode D3 and the fourth diode D4 are turned on, the second scan line Scan2 is directly connected to the light-emitting control signal line Emit, which causes competition of signals, thus influences writing of data signal, and thus influences the normal light emission of the light-emitting diode D. However, after the second thin film transistor T2 is included in the first electrostatic protection circuit 5, during the data writing period t2, the second thin film transistor T2 will be turned off under an action of the high level signal provided by the light-emitting control signal line Emit so that the second scan line Scan2 is cut off from the light-emitting control signal line Emit, thereby ensuring normal writing of the data signal.

In an embodiment in which the second thin film transistor and the thin film transistors in the pixel circuits 4 are all N-type thin film transistors, the first electrode of the third diode is a negative electrode, the second electrode of the third diode is a positive electrode, the first electrode of the fourth diode is a negative electrode, and the second electrode of the fourth diode is a positive electrode.

Figure 11:
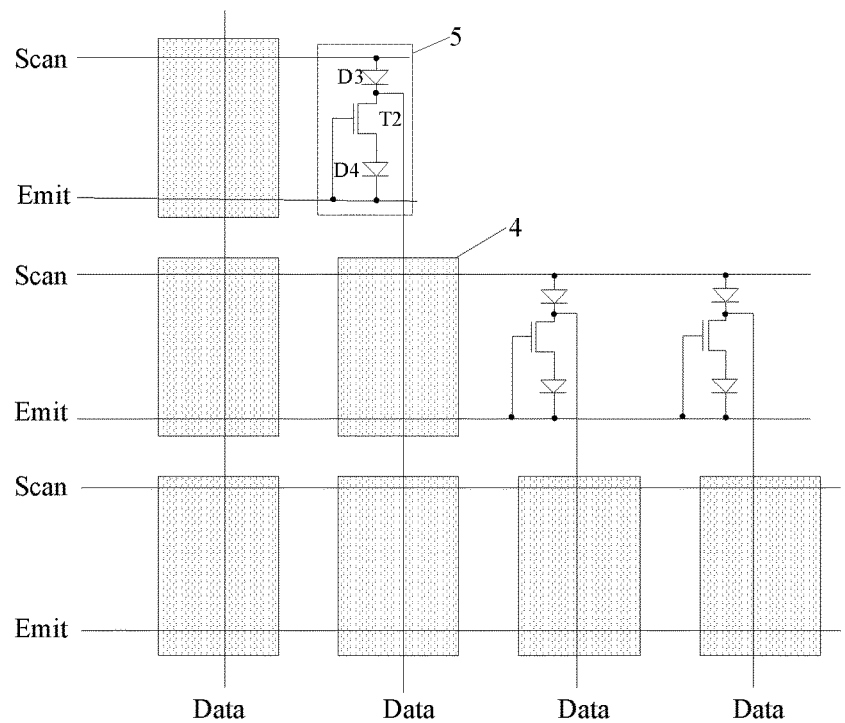
FIG. 11 illustrates a fourth structural schematic diagram of a first electrostatic protection circuit according to an embodiment of the present disclosure.

As shown in FIG. 11, when the second thin film transistor T2 is an N-type thin film transistor, the negative electrode of the third diode D3 is connected to both the first electrode of the second thin film transistor T2 and the corresponding data line Data, the positive electrode of the third diode D3 is connected to the corresponding scan line Scan, the positive electrode of the fourth diode D4 is connected to the second electrode of the second thin film transistor T2, and the negative electrode of the fourth diode D4 is connected to both the gate electrode of the second thin film transistor T2 and the corresponding light-emitting control signal line Emit.

When the second thin film transistor T2 and the thin film transistors in the pixel circuits 4 are all N-type thin film transistors, the driving process of the display panel and the working principles of the first electrostatic protection circuit 5 are similar to those shown in FIG. 9, which is not repeated herein.

The first electrostatic protection circuit 5 may include a third thin film transistor, a fourth thin film transistor, a fifth diode, and a sixth diode. The third thin film transistor and the fourth thin film transistor are of the same type as the thin film transistors in the pixel circuits 4. A first electrode of the fifth diode is connected to a first electrode of a third thin film transistor, a second electrode of the fifth diode is connected to the corresponding scan line Scan, a second electrode of the third thin film transistor is connected to both the corresponding data line Data and a first electrode of the fourth thin film transistor, a second electrode of the sixth diode is connected to a second electrode of the fourth thin film transistor, a first electrode of the sixth diode is connected to all of the corresponding light-emitting control signal line Emit, a gate electrode of the third thin film transistor, and a gate electrode of the fourth thin film transistor.

In an embodiment in which the first thin film transistor and the thin film transistors in the pixel circuits 4 are all P-type thin film transistors, the first electrode of the first diode is a positive electrode, the second electrode of the first diode is a negative electrode, the first electrode of the second diode is a positive electrode, and the second electrode of the second diode is a negative electrode.

Figure 12:
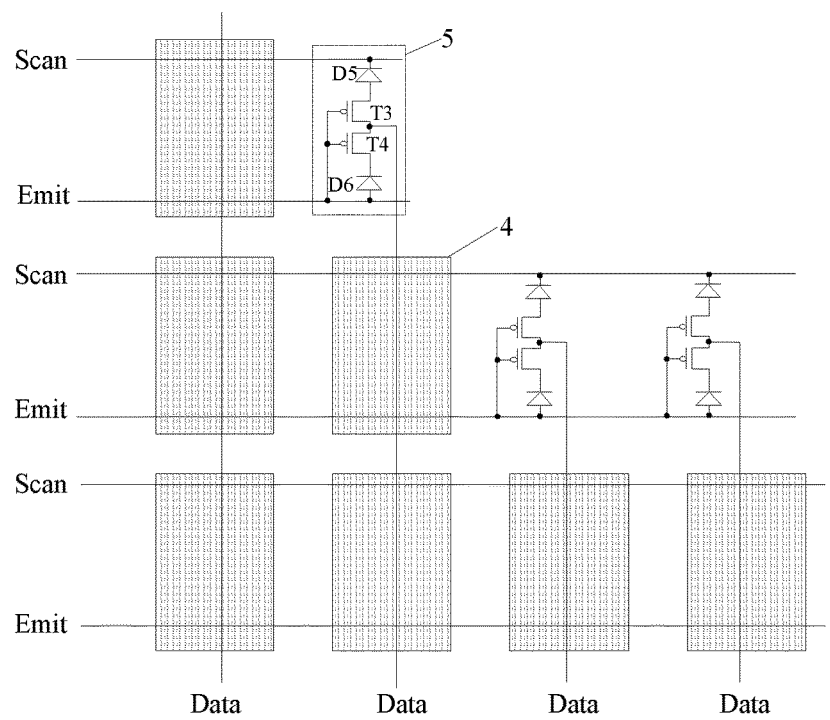
FIG. 12 illustrates a fifth structural schematic diagram of a first electrostatic protection circuit according to an embodiment of the present disclosure.

As shown in FIG. 12, when both the third thin film transistor T3 and the fourth thin film transistor T are P-type thin film transistors, the positive electrode of the fifth diode D5 is connected to the first electrode of the third thin film transistor T3, the negative electrode of the fifth diode D5 is connected to the corresponding scan line Scan, the second electrode of the third thin film transistor T3 is connected to both the corresponding data line Data and the first electrode of the fourth thin film transistor T4, the negative electrode of the sixth diode D6 is connected to the second electrode of the fourth thin film transistor T4, the positive electrode of the sixth diode D6 is connected to all of the corresponding light-emitting control signal line Emit, the gate electrode of the third thin film transistor T3, and the gate electrode of the fourth thin film transistor T4.

Based on the pixel circuit 4 shown in FIG. 7 and the signal sequence diagram shown in FIG. 8, in both the initialization period t1 and the data writing period t2, the light-emitting control signal line Emit provides the high level signal and both the third thin film transistor T3 and the fourth thin film transistor T4 are turned off. In the light emitting period t3, the light-emitting control signal line Emit provides a low level light-emitting control signal, the third thin film transistor T3 and the fourth thin film transistor T4 are turned on, and the first electrostatic protection circuit 5 works.

It should be noted that, in the data writing period t2, if the first electrostatic protection circuit 5 does not include the third thin film transistor T3 and the fourth thin film transistor T4, the second scan line Scan2 will provide a first scan signal of a low level and the light-emitting control signal line Emit will provide a high level signal so that both the fifth diode D5 and the sixth diode D6 will be turned on and the second scan line Scan2 will be directly connected to the light-emitting control signal line Emit, which causes competition of signals, thus influences writing of data signal, and influences the normal light emission of the light-emitting diode D. However, after the third thin film transistor T3 and the fourth thin film transistor T4 are included in the first electrostatic protection circuit 5, the third thin film transistor T3 and the fourth thin film transistor T4 will be turned off under an action of the high level signal provided by the light-emitting control signal line Emit during the data writing period t2, so that the second scan line Scan2 is cut off from the light-emitting control signal line Emit, thereby ensuring normal writing of the data signal.

If only one thin film transistor is included in the first electrostatic protection circuit 5, taking FIG. 6 for example, when there is no signal transmitted through the data line Data, the light-emitting control signal line Emit charges the data line Data via the second diode D2. When the data line Data transmits the data signal to the pixel circuits 4, the light-emitting control signal provided by the light-emitting control signal line Emit may adversely influence the data signal on the data line Data.

In the data writing period t2, the light-emitting control signal line Emit provides a high level light-emitting control signal. If the potential of a normal data signal transmitted by the data line Data is lower than the potential of the light-emitting control signal in the data writing period t2, there will be charge transfer between the light-emitting control signal line Emit and the data line Data, which causes the potential of the data signal to rise and deviate from the normal value. In contrast, by using the structure shown in FIG. 12, since the fourth thin film transistor T4 is provided between the data line Data and the light-emitting control signal line Emit, the fourth thin film transistor T4 is turned off in the data writing period t2 so that the data line Data is cut off from the light-emitting control signal line Emit, which prevents the charge on the light-emitting control signal line Emit from transferring to the data line Data. The third thin film transistor T3 has the same working principles, which are not repeated herein.

By providing the third thin film transistor T3 and the fourth thin film transistor T4, the data line Data is cut off from both the scan line Scan and the light-emitting control signal line Emit during both the initialization period t1 and the data writing period t2, which avoids the adverse influence caused by the first scan signal and the light-emitting control signal on the data signal.

In an embodiment, when the third thin film transistor, the fourth thin film transistor, and the thin film transistors in the pixel circuits 4 are all N-type thin film transistors, the first electrode of the fifth diode is a negative electrode, the second electrode of the fifth diode is a positive electrode, the first electrode of the sixth diode is negative electrode, and a second electrode of the sixth diode is a positive electrode.

Figure 13:
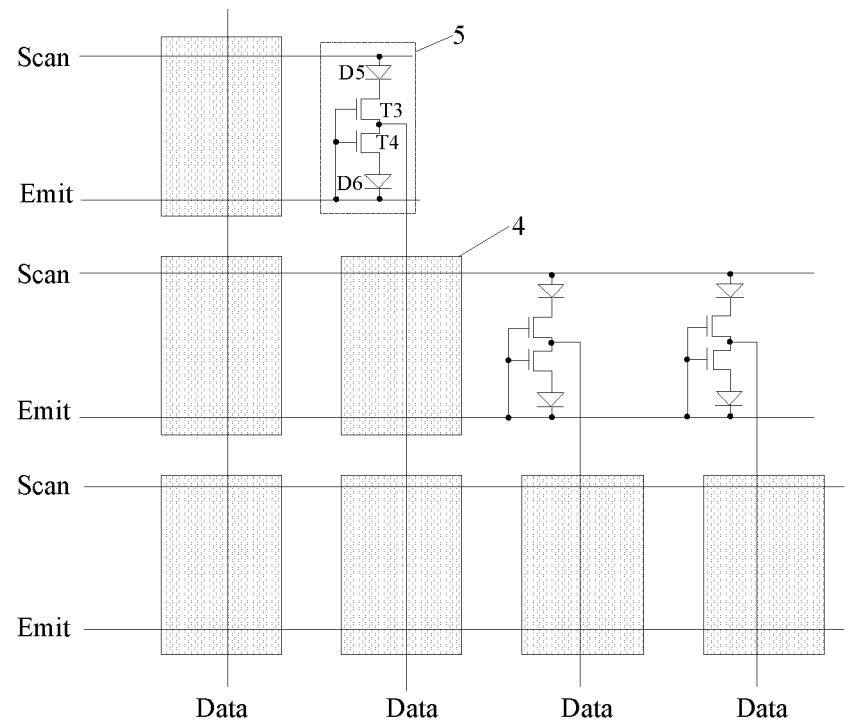
FIG. 13 illustrates a sixth structural schematic diagram of a first electrostatic protection circuit according to an embodiment of the present disclosure.

As shown in FIG. 13, when both the third thin film transistor T3 and the fourth thin film transistor T4 are N-type thin film transistors, the negative electrode of the fifth diode D5 is connected to the first electrode of the third thin film transistor T3, the positive electrode of the fifth diode D5 is connected to the corresponding scan line Scan, the second electrode of the third thin film transistor T3 is connected to both the corresponding data line Data and the first electrode of the fourth thin film transistor T4, the positive electrode of the sixth diode D6 is connected to the second electrode of the fourth thin film transistor T4, the negative electrode of the sixth diode D6 is connected to all of the corresponding light-emitting control signal line Emit, the gate electrode of the third thin film transistor T3, and the gate electrode of the fourth thin film transistor T4.

In the initialization period t1 and the data writing period t2, the light-emitting control signal line Emit provides a low level signal and both the third thin film transistor T3 and the fourth thin film transistor T4 are turned off. In the light emitting period t3, the light-emitting control signal line Emit provides a high level signal, both the third thin film transistor T3 and the fourth thin film transistor T4 are turned on, and the first electrostatic protection circuit 5 works.

By using such structure, in the initialization period t1 and the data writing period t2, when a normal data signal is transmitted through the data line Data, both third thin film transistor T3 connecting the data line Data to the scan line Scan and the fourth thin film transistor T4 connecting the data line Data to the light-emitting control signal line Emit are in a turn-off state, which avoids charges on the data line Data from transferring to the scan line Scan or the light-emitting control signal line Emit, thereby avoiding the data signal from deviating from the normal value or influencing the normal display.

Further, in order to verify that the first electrostatic protection circuits 5 provided by the embodiments of the present disclosure can provide electrostatic protection for the data lines Data, functions of the first electrostatic protection circuit 5 provided in the embodiments of the present disclosure and the electrostatic protection circuit in the related art are simulated.

Figure 14:
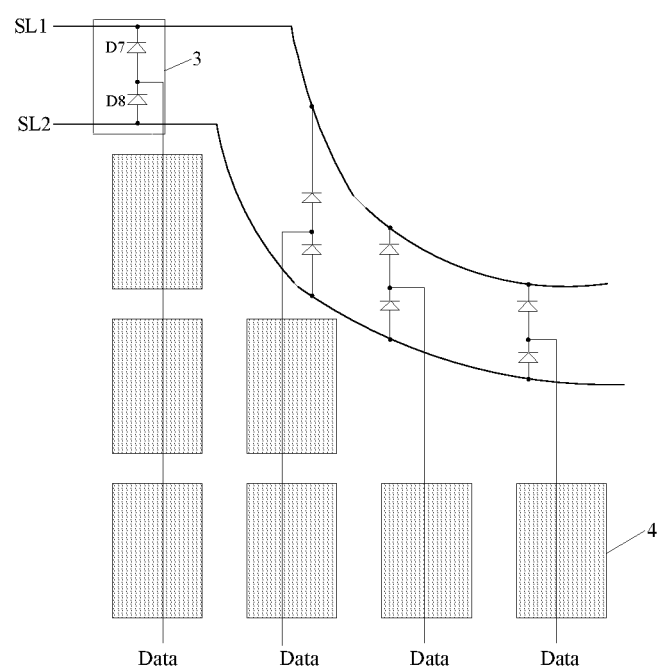
FIG. 14 illustrates a structural schematic diagram of an electrostatic protection circuit in the related art.

As shown in FIG. 14, an existing electrostatic protection circuit 3 includes a seventh diode D7 and an eighth diode D8. A negative electrode of the seventh diode D7 is connected to the first signal line SL1, a positive electrode of the seventh diode D7 is connected to both the data line Data and a negative electrode of the eighth diode D8, and a positive electrode of the eighth diode D8 is connected to the second signal line SL2. When the potential of the data signal transmitted through the data line Data is greater than the potential of the high level signal provided by the first signal line SL1, the seventh diode D7 is turned on and static electricity on the data line Data is discharged via the first signal line SL1. When the potential of the data signal transmitted through data line Data is smaller than the potential of the low level signal provided by the second signal line SL2, the eighth diode D8 is turned on and the static electricity on the data line Data is discharged via the second signal line SL2.

Figure 15A:
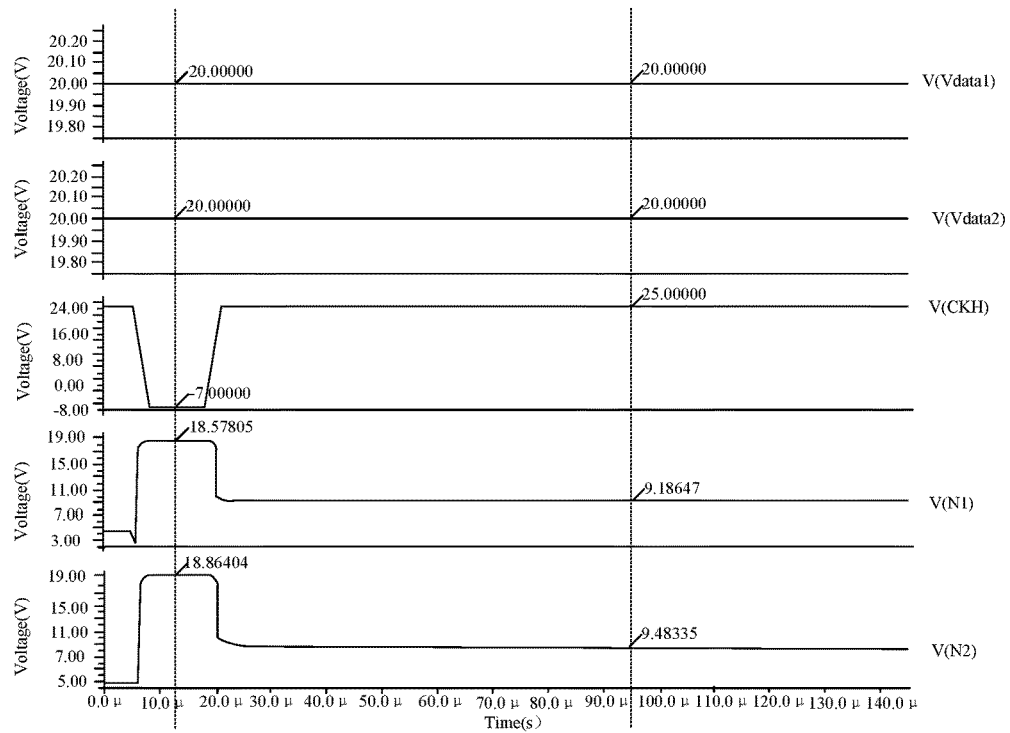
FIG. 15A illustrates a signal simulation comparison diagram of an electrostatic protection circuit in the related art.
Figure 15B:
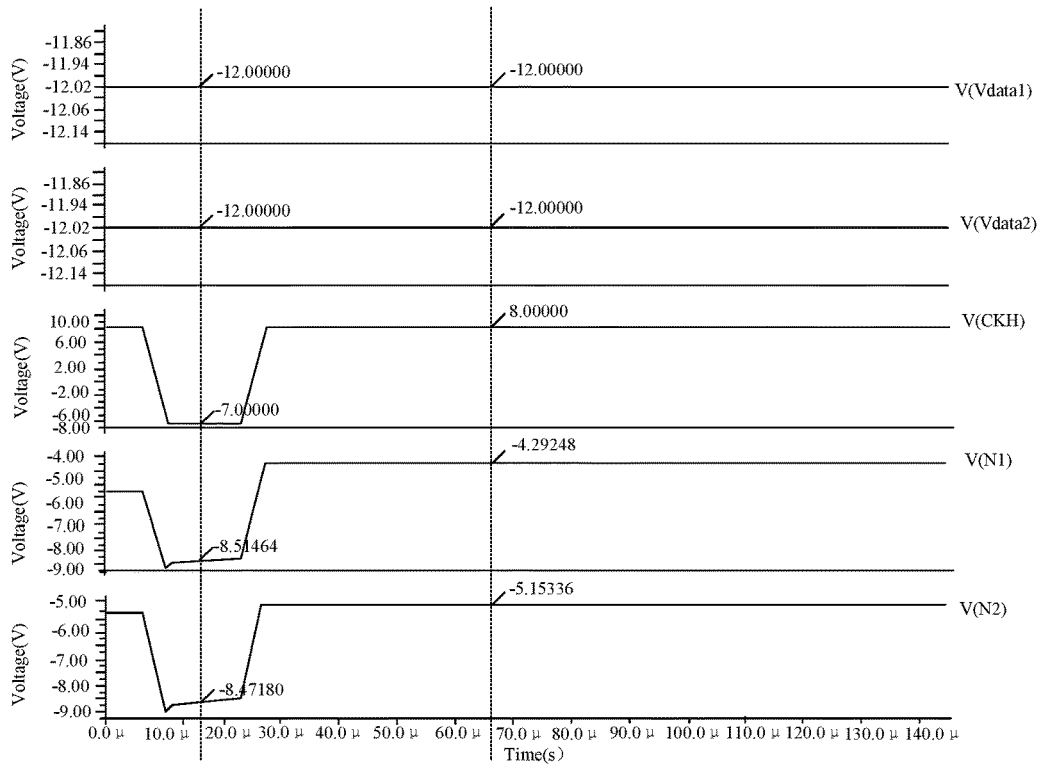
FIG. 15B illustrates a signal simulation comparison diagram of the first electrostatic protection circuit shown in FIG. 6.

The functions of the electrostatic protection circuit 3 in the related art and the first electrostatic protection circuit 5 of the embodiments of the present disclosure shown in FIG. 6 are simulated, and the obtained simulation comparison diagrams are shown in FIG. 15A and FIG. 15B.

The curve represented by V(CKH) is used to indicate abnormity of the data signal. When abnormity appears in the data signal transmitted by the data line Data, the curved represented by V(CKH) may fluctuate. V(Vdata1) and V(N1) represent curves in the related art, and V(Vdata2) and V(N2) represents curves of the embodiments of the present disclosure.

For example, normal data signals transmitted by the data lines have a reasonable threshold range of 9.0V~−4.0V. Based on FIG. 15A, when the data signal transmitted by the data line Data is 20V and higher than the maximum threshold value 9V and there is no electrostatic protection for the data line Data in both the related art and the embodiments of the present disclosure, it can be seen from the curves represented by V(Vdata1) and V(Vdata2) that the potential of the data signal transmitted by the data line Data is always 20.0V.

After the electrostatic protection circuit 3 in the related art is used to provide electrostatic protection for the data line, it can be seen from the curve represented by V(N1) that the potential of the data signal decreases to 9.18647 V which is close to the maximum threshold value 9V. After the first electrostatic protection circuit 5 is used to provide electrostatic protection for the data line, it can be seen from the curve represented by V(N2) that the potential of the data signal decreases to 9.48335V which is close to the maximum threshold value 9V.

Based on FIG. 15B, when the data signal transmitted via the data line Data is −12V and lower than the minimum threshold value −4V and there is no electrostatic protection for the data line Data in both the related art and the embodiments of the present disclosure, it can be seen from the curves represented by V(Vdata1) and V(Vdata2) that the potential of the data signal transmitted via the data line Data is always −12V.

After the electrostatic protection circuit 3 in the related art is used to provide electrostatic protection for the data line, it can be seen from the curve represented by V(N1) that the potential of the data signal rises to −4.29248V which is close to the minimum threshold value −4V. After the first electrostatic protection circuit 5 is used to provide electrostatic protection for the data line, it can be seen from the curve represented by V(N2) that the potential of the data signal rises to −5.15336V which is close to the minimum threshold value −4V.

Thus, when the potential of the data signal is excessively high or excessively low, the first electrostatic protection circuit 5 shown in FIG. 6 can provide electrostatic protection for the data line and adjusts the potential of the data signal to a value close to the threshold value.

Figure 16A:
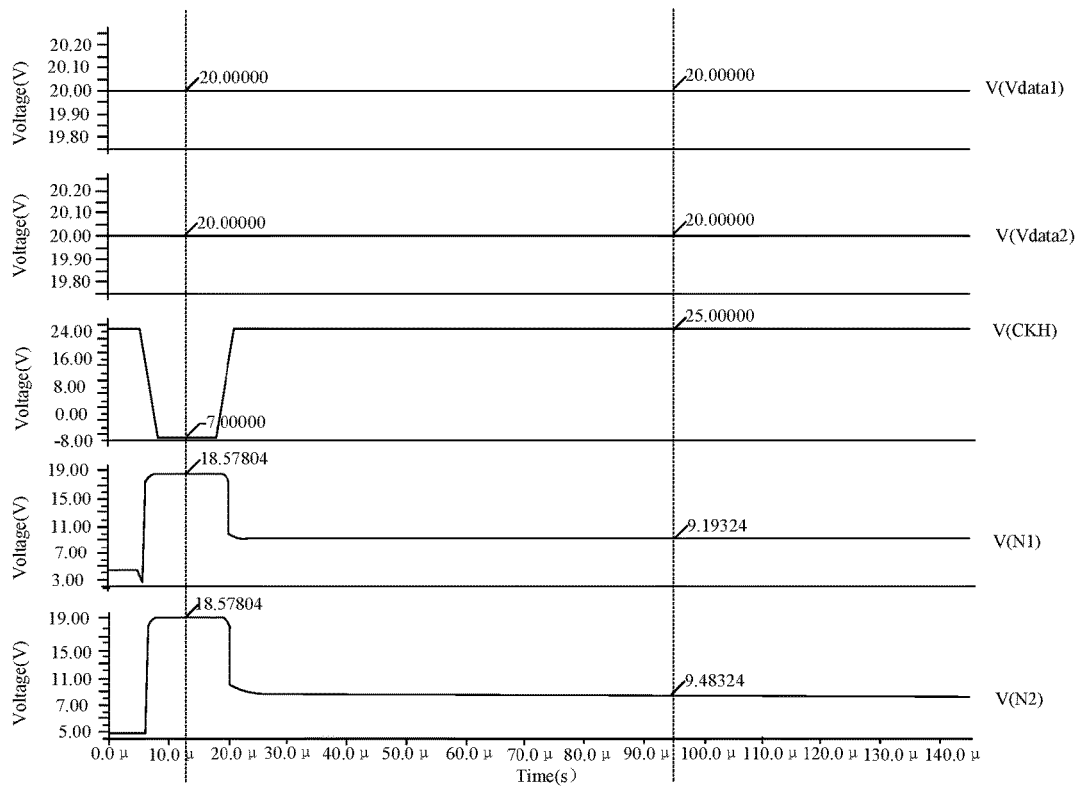
FIG. 16A illustrates a signal simulation comparison diagram of an electrostatic protection circuit in the related art.
Figure 16B:
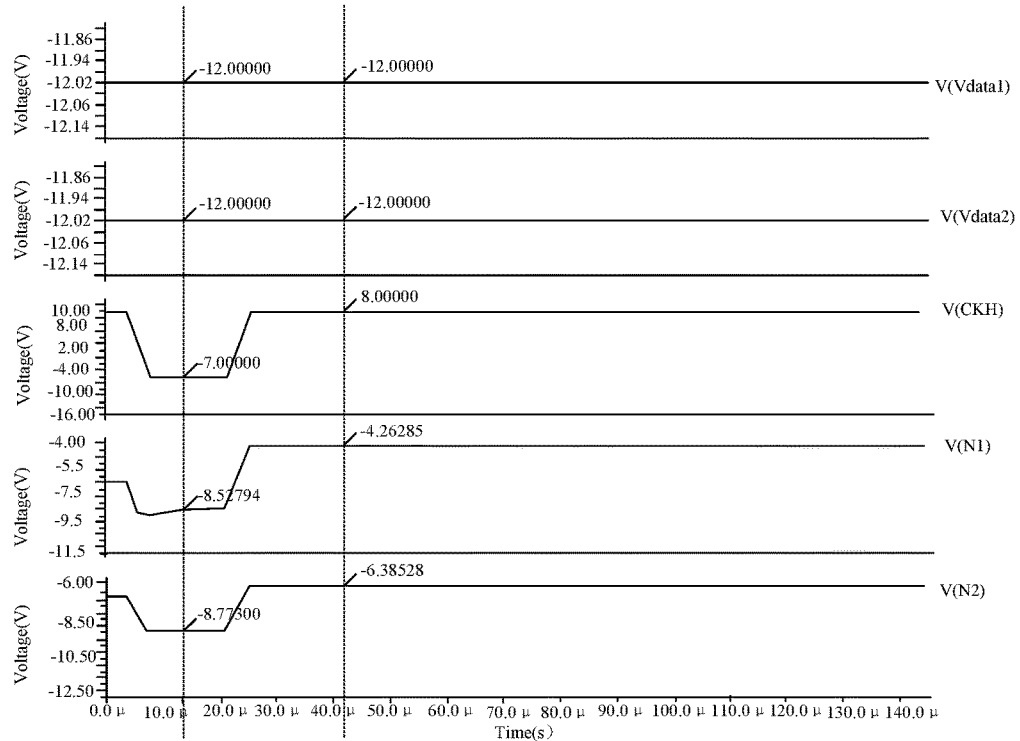
FIG. 16B illustrates a signal simulation comparison diagram of the first electrostatic protection circuit shown in FIG. 10.

Functions of the electrostatic protection circuit 3 in the related art and the first electrostatic protection circuit 5 provided in the embodiments of the present disclosure shown in FIG. 10 were simulated, and the simulation comparison diagrams are shown in FIG. 16A and FIG. 16B. Functions of the electrostatic protection circuit 3 and the provided in the embodiments of the present disclosure shown in FIG. 12 were simulated, and the simulation comparison diagrams are shown in FIG. 17A and FIG. 17B.

Figure 17A:
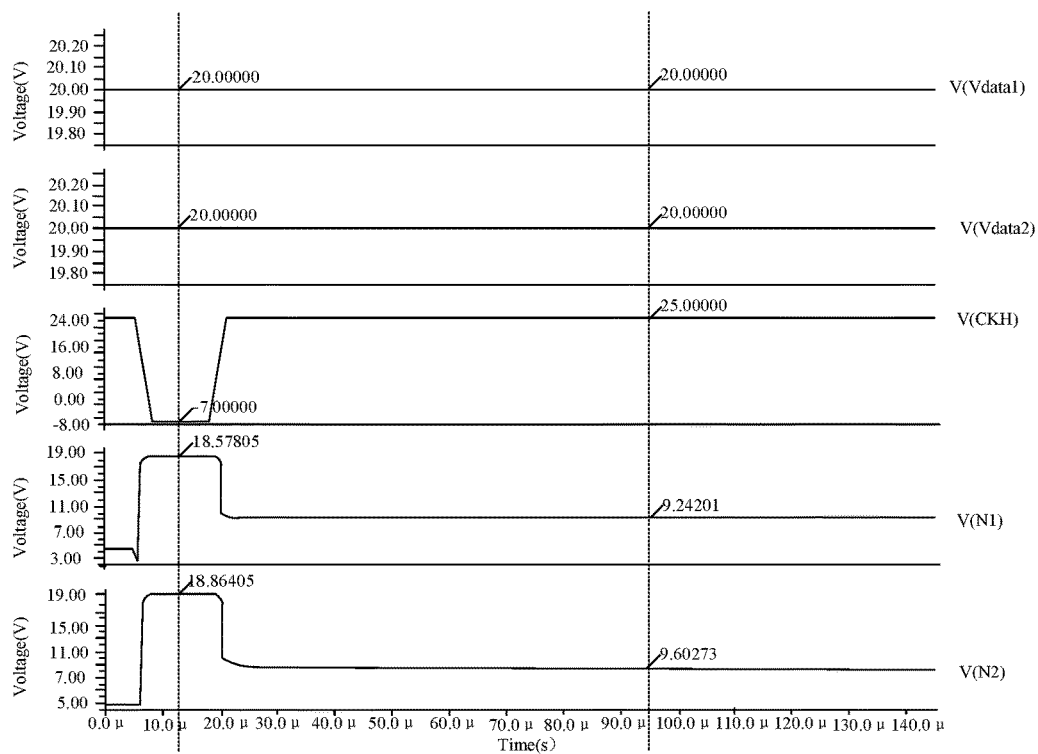
FIG. 17A illustrates a signal simulation comparison diagram of an electrostatic protection circuit in the related art.
Figure 17B:
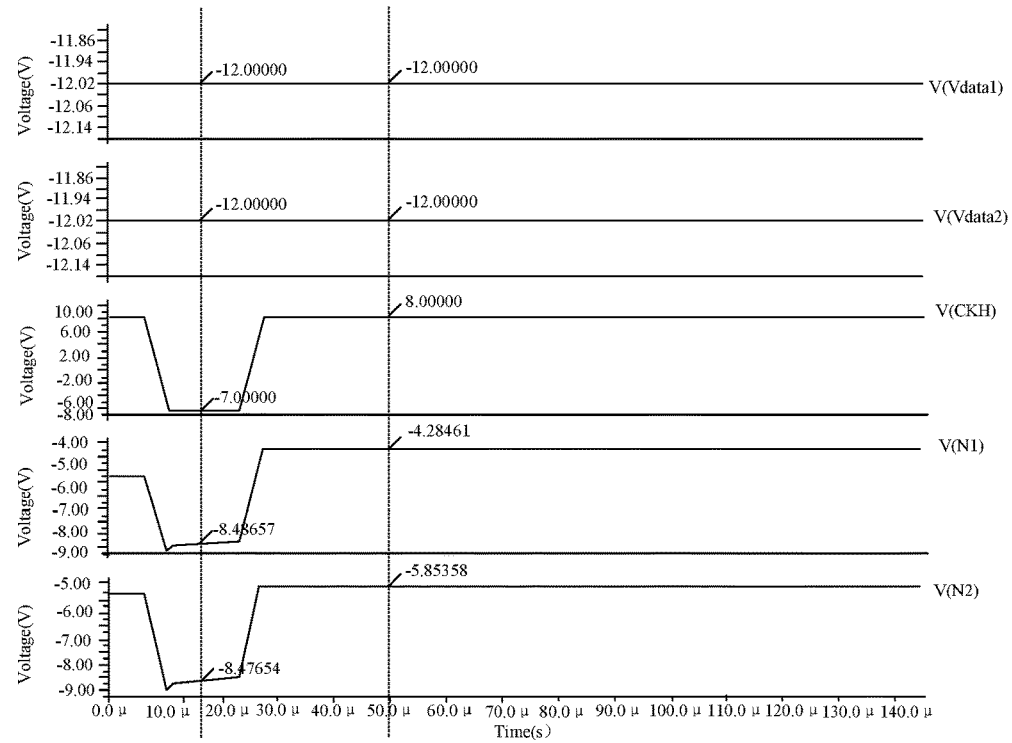
FIG. 17B illustrates a signal simulation comparison diagram of the first electrostatic protection circuit shown in FIG. 12.

It can be seen that the result of the curve shown in FIG. 16A and the result of the curve shown in FIG. 17A are consistent with the result of the simulation curve shown in FIG. 15A, and the result of the curve shown in FIG. 16B and the result of the curve shown in FIG. 17B are consistent with the result of the simulation curve shown in FIG. 15B, which are not repeated herein.

Figure 18:
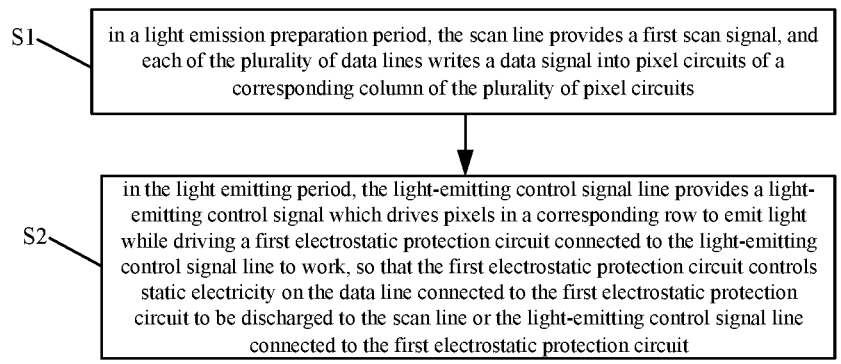
FIG. 18 is a flow chart of a driving method of a display panel according to an embodiment of the present disclosure.

An embodiment of the present disclosure further provides a driving method of the display panel. The driving method is applied in the display panel. As shown in FIG. 18, the driving method of the display panel includes:

step S1: in a light emission preparation period, the scan line provides a first scan signal, and each of the plurality of data lines writes a data signal into pixel circuits of a corresponding column of the plurality of pixel circuits.

step S2: in the light emitting period, the light-emitting control signal line provides a light-emitting control signal which drives pixels in a corresponding row to emit light while driving a first electrostatic protection circuit connected to the light-emitting control signal line to work, so that the first electrostatic protection circuit controls static electricity on the data line connected to the first electrostatic protection circuit to be discharged to the scan line or the light-emitting control signal line connected to the first electrostatic protection circuit.

The abovementioned light emission preparation period includes an initialization period t1 and a data writing period t2. The scan lines for providing the first scan signals may be the first scan lines or the second scan lines in the pixel circuit shown in FIG. 7.

Based on the driving method of the display panel provided in the embodiments of the present disclosure, in the light emitting period, the light-emitting control signal provided by the light-emitting control signal line drives the pixels to emit light while driving the first electrostatic protection circuit to work, so that the static electricity on the data line is discharged to the scan line or the light-emitting control signal line connected to the first electrostatic protection circuit. As such, there is no need to provide additional discharge path for the first electrostatic protection circuits, i.e., there is no need to provide the first signal line and the second signal line in the related art for these data lines. Therefore, the space is saved to a certain extent, and the border corresponding to the second display area can be formed narrower.

Further, since the static electricity on the data lines is discharged via the corresponding scan lines or the light-emitting control signal lines, the data signals on the data lines can return to normal, the display panel can display normal images, and thus the problem of non-uniform brightness of images due to unstable data signal can be avoided.

In an embodiment, the first electrostatic protection circuit includes a first thin film transistor, a first diode, and a second diode. Further with reference to FIGS. 6-8, when the first thin film transistor and the thin film transistors in the pixel circuits are all P-type thin film transistors and the scan lines connected to the first electrostatic protection circuits are the second scan lines in the pixel circuits, the second scan lines Scan 2 provide a first scan signal of a low level in the data writing period t2; and, in the light emitting period t3, the light-emitting control signal lines Emit provide a light-emitting control signal of a low level, under driving of which, the first thin film transistors T1 in the first electrostatic protection circuits 5 connected to the light-emitting control signal lines Emit are turned on.

When the first thin film transistor and the thin film transistor in the pixel circuits are all N-type thin film transistors and the scan lines connected to the first electrostatic protection circuits are the second scan lines in the pixel circuits, the second scan lines Scan 2 provide first scan signals of a high level in the data writing period t2; and, in the light emitting period t3, the light-emitting control signal lines Emit provide light-emitting control signals of a high level, under driving of which, the first thin film transistors T1 in the first electrostatic protection circuits 5 connected to the light-emitting control signal lines Emit are turned on.

When the first electrostatic protection circuit includes a third thin film transistor, a fourth thin film transistor, a fifth diode, and a sixth diode, the third thin film transistor, the fourth thin film transistor, and the thin film transistors in the pixel circuits are all P-type thin film transistors, and the scan lines connected to the first electrostatic protection circuits are the second scan lines in the pixel circuits, based on FIGS. 12, 7 and 8, the second scan lines Scan2 provide first scan signals of a low level in the data writing period t2; and, in the light emitting period t3, the light-emitting control signal lines Emit provide low level light-emitting control signals, under driving of which, the third thin film transistors T3 and the fourth thin film transistor T4 in the first electrostatic protection circuits 5 connected to the light-emitting control signal lines Emit are turned on.

When the third thin film transistor, the fourth thin film transistor, and the thin film transistors in the pixel circuits are all N-type thin film transistors and the scan lines connected to the first electrostatic protection circuits are the second scan lines in the pixel circuits, based on FIG. 13, the second scan lines Scan2 provides first scan signals of a high level in the data writing period t2; and in the light emitting period t3, the light-emitting control signal lines Emit provide high level light-emitting control signals, under driving of which, the third thin film transistors T3 and the fourth thin film transistor T4 in the first electrostatic protection circuits 5 connected to the light-emitting control signal lines Emit are turned on.

The driving method of the display panels corresponding to different first electrostatic protection circuits and the working principles of the first electrostatic protection circuits are already illustrated in details in the above embodiments, which are not repeated herein.

Figure 19:
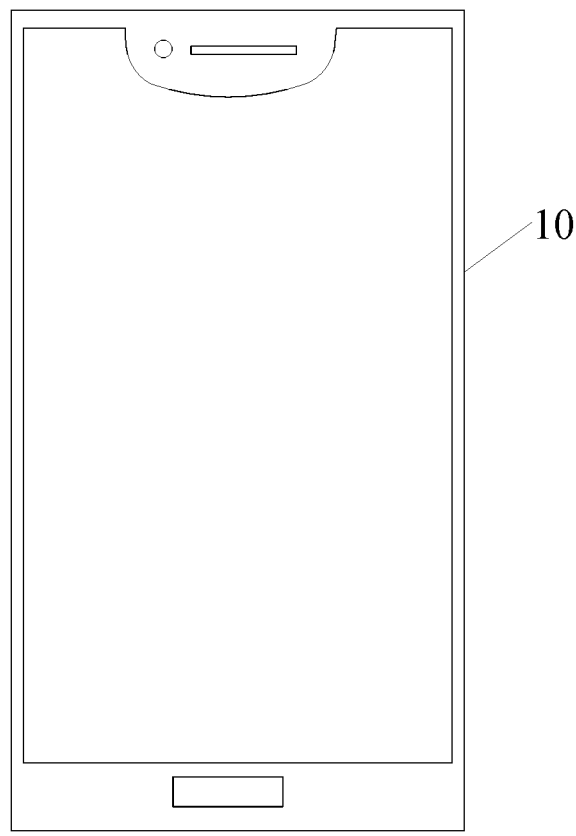
FIG. 19 illustrates a structural schematic diagram of a display device according to an embodiment of the present disclosure.

An embodiment of the present disclosure further provides a display device. As shown in FIG. 19, the display device 10 includes the display panel as described above. The specific structure and driving method of the display panel are similar to those in the embodiments above, which are not repeated herein. The display device 10 shown in FIG. 19 is merely exemplary and the display device may be any electronic device having display function, such as cell phone, tablet computer, laptop, e-book, TV set, and so on.

Since the display device includes the display panel of the embodiments of the present disclosure, the display device can not only provide electrostatic protection for the display panel, but also further reduce the space that may be occupied by the first signal lines and the second signal line, thereby achieving better narrow border.

The above are merely preferable embodiments of the present disclosure, which are not intended to limit the present disclosure. Any modification, equivalent substitution, or improvement made within the principles of the present disclosure shall fall into the protection scope of the present disclosure.

What is claimed is:

1. A display panel, comprising:
   a plurality of pixel circuits arranged in a display area of the display panel, wherein the plurality of pixel circuits is arranged in rows and columns, the display area of the display panel comprises a first display area and a second display area arranged along a row direction, and an outer edge of the second display area extends stepwise along a column direction;
   a plurality of data lines each extending along the column direction, wherein the plurality of data lines corresponds to a plurality of columns of the plurality of pixel circuits in one-to-one correspondence;
   a plurality of signal line groups, wherein the plurality of signal line groups corresponds to a plurality of rows of the plurality of pixel circuits in one-to-one correspondence, and each of the plurality of signal line groups comprises a scan line and a light-emitting control signal line each extending along the row direction; and
   a plurality of first electrostatic protection circuits, wherein the plurality of first electrostatic protection circuits corresponds and is connected to the data lines in the second display area in one-to-one correspondence, each of the plurality of first electrostatic protection circuits is electrically connected to a scan line and a light-emitting control signal line of a same signal line group, and each of the plurality of first electrostatic protection circuits is used to discharge static electricity on a data line connected to the first electrostatic protection circuit to the scan line or the light-emitting control signal line connected to the first electrostatic protection circuit.

2. The display panel according to claim 1, wherein the plurality of first electrostatic protection circuits is located in a first non-display area, and the first non-display area is a non-display area corresponding to a stepwise area of the second display area;
   a first pixel circuit in a $y^{th}$ column of the plurality of pixel circuits is located in an $x^{th}$ row of the plurality of pixel circuits, a data line corresponding to the $y^{th}$ column is connected to one of the plurality of first electrostatic protection circuits, and the first electrostatic protection circuit is further connected to a scan line and a light-emitting control signal line corresponding to any row of first to $(x-1)^{th}$ rows of the plurality of pixel circuits, wherein the pixel circuits in the first to $(x-1)^{th}$ rows are located at a side of pixel circuits in the $x^{th}$ row close to the stepwise area, wherein x is a positive integer greater than 2 and y is a positive integer greater than or equal to 1.

3. The display panel according to claim 2, wherein the first electrostatic protection circuit connected to the data line corresponding to the $y^{th}$ column is connected to both the scan line and the light-emitting control signal line corresponding to the $(x-1)^{th}$ row.

4. The display panel according to claim 1, wherein a first pixel circuit of an $i^{th}$ column of the plurality of pixel circuits is located in a first row of the plurality of pixel circuits, the display panel further comprises a dummy pixel circuit at a side of the first row away from a second row of the plurality of pixel circuits, and the dummy pixel circuit corresponds to one of the scan lines and one of the light-emitting control signal lines;
   wherein the data line corresponding to the $i^{th}$ column is connected to one first electrostatic protection circuit of the plurality of first electrostatic protection circuits, and the first electrostatic protection circuit is connected to both the scan line and the light-emitting control signal line corresponding to the dummy pixel circuit; and
   wherein i is a positive integer greater than or equal to 1.

5. The display panel according to claim 1, wherein each of the plurality of first electrostatic protection circuits includes a first thin film transistor, a first diode, and a second diode, wherein the first thin film transistor is of a same type as thin film transistors in the plurality of pixel circuits;
   wherein a first electrode of the first diode is connected to a first electrode of the first thin film transistor and a second electrode of the first diode is connected to the corresponding scan line;
   wherein a second electrode of the second diode is connected to both a second electrode of the first thin film transistor and the corresponding data line, and a first electrode of the second diode is connected to both a gate electrode of the first thin film transistor and the corresponding light-emitting control signal line.

6. The display panel according to claim 5, wherein the first thin film transistor is a P-type thin film transistor, the first electrode of the first diode is a positive electrode, the second electrode of the first diode is a negative electrode, the first electrode of the second diode is a positive electrode, and the second electrode of the second diode is a negative electrode.

7. The display panel according to claim 5, wherein the first thin film transistor is an N-type thin film transistor, the first electrode of the first diode is a negative electrode, the second electrode of the first diode is a positive electrode, the first electrode of the second diode is a negative electrode, and the second electrode of the second diode is a positive electrode.

8. The display panel according to claim 1, wherein each first electrostatic protection circuit of the plurality of first electrostatic protection circuits comprises a second thin film transistor, a third diode, and a fourth diode, wherein the second thin film transistor is of a same type as thin film transistors in the plurality of pixel circuits;
   wherein a first electrode of the third diode is connected to both a first electrode of the second thin film transistor and the corresponding data line, and a second electrode of the third diode is connected to the corresponding scan line; and
   wherein a second electrode of the fourth diode is connected to a second electrode of the second thin film transistor, and a first electrode of the fourth diode is connected to both a gate electrode of the second thin film transistor and the corresponding light-emitting control signal line.

9. The display panel according to claim 8, wherein the second thin film transistor is a P-type thin film transistor, the first electrode of the third diode is a positive electrode, the second electrode of the third diode is a negative electrode, the first electrode of the fourth diode is a positive electrode, and the second electrode of the fourth diode is a negative electrode.

10. The display panel according to claim 8, wherein the second thin film transistor is an N-type thin film transistor, the first electrode of the third diode is a negative electrode, the second electrode of the third diode is a positive electrode, the first electrode of the fourth diode is a negative electrode, and the second electrode of the fourth diode is a positive electrode.

11. The display panel according to claim 1, wherein each of the plurality of first electrostatic protection circuits comprises a third thin film transistor, a fourth thin film transistor, a fifth diode, and a sixth diode, wherein the third thin film transistor and the fourth thin film transistor are of a same type as thin film transistors in the plurality of pixel circuits;
  a first electrode of the fifth diode is connected to a first electrode of the third thin film transistor, and a second electrode of the fifth diode is connected to the corresponding scan line;
  wherein a second electrode of the third thin film transistor is connected to both the corresponding data line and a first electrode of the fourth thin film transistor;
  wherein a second electrode of the sixth diode is connected to a second electrode of the fourth thin film transistor, and a first electrode of the sixth diode is connected to all of the corresponding light-emitting control signal line, a gate electrode of the third thin film transistor, and a gate electrode of the fourth thin film transistor.

12. The display panel according to claim 11, wherein both the third thin film transistor and the fourth thin film transistor are P-type thin film transistors, the first electrode of the fifth diode is a positive electrode, the second electrode of the fifth diode is a negative electrode, the first electrode of the sixth diode is a positive electrode, and the second electrode of the sixth diode is a negative electrode.

13. The display panel according to claim 11, wherein both the third thin film transistor and the fourth thin film transistor are N-type thin film transistors, the first electrode of the fifth diode is a negative electrode, the second electrode of the fifth diode is a positive electrode, the first electrode of the sixth diode is a negative electrode, and the second electrode of the sixth diode is a positive electrode.

14. A driving method of a display panel, wherein the display panel comprises:
  a plurality of pixel circuits arranged in a display area of the display panel, wherein the plurality of pixel circuits is arranged in rows and columns, the display area comprises a first display area and a second display area arranged along a row direction, and an outer edge of the second display area extends stepwise along a column direction;
  a plurality of data lines each extending along the column direction, wherein the plurality of data lines corresponds to a plurality of columns of the plurality of pixel circuits in one-to-one correspondence;
  a plurality of signal line groups, wherein the plurality of signal line groups corresponds to a plurality of rows of the plurality of pixel circuits in one-to-one correspondence, and each of the plurality of signal line groups comprises a scan line and a light-emitting control signal line each extending along the row direction; and
  a plurality of first electrostatic protection circuits, wherein the plurality of first electrostatic protection circuits corresponds and is connected to the data lines in the second display area in one-to-one correspondence, each of the plurality of first electrostatic protection circuits is electrically connected to a scan line and a light-emitting control signal line of a same signal line group, and each of the plurality of first electrostatic protection circuits is used to discharge static electricity on a data line connected to the first electrostatic protection circuit to the scan line or the light-emitting control signal line connected to the first electrostatic protection circuit,
wherein the driving method comprises:
  in a light emission preparation period, providing, by the scan line, a first scan signal, and writing, by each of the plurality of data lines, a data signal into pixel circuits of a corresponding column of the plurality of pixel circuits; and
  in a light emitting period, providing, by the light-emitting control signal line, a light-emitting control signal which drives pixels in a corresponding row to emit light while driving a first electrostatic protection circuit connected to the light-emitting control signal line to work, so that the first electrostatic protection circuit controls static electricity on the data line connected to the first electrostatic protection circuit to be discharged to the scan line or the light-emitting control signal line connected to the first electrostatic protection circuit.

15. The driving method according to claim 14, wherein each of the plurality of first electrostatic protection circuits comprises a first thin film transistor, a first diode, and a second diode,
  wherein when the first thin film transistor is a P-type thin film transistor, the scan line provides a low level first scan signal in the light emission preparation period, and in the light emitting period, the light-emitting control signal line provides a low level light-emitting control signal, under driving of which, the first thin film transistor in the first electrostatic protection circuit connected to the light-emitting control signal line is turned on;
  wherein when the first thin film transistor is an N-type thin film transistor, the scan line provides a high level first scan signal in the light emission preparation period, and in light emitting period, the light-emitting control signal line provides a high level light-emitting control signal, under driving of which, the first thin film transistor in the first electrostatic protection circuit connected to the light-emitting control signal line is turned on.

16. The driving method according to claim 14, wherein each of the plurality of first electrostatic protection circuits comprises a third thin film transistor, a fourth thin film transistor, a fifth diode, and a sixth diode,
  wherein when both the third thin film transistor and the fourth thin film transistor are P-type thin film transistors, the scan line provides a low level first scan signal in the light emission preparation period, and in the light emitting period, the light-emitting control signal line provides a low level light-emitting control signal, under driving of which, the third thin film transistor and the fourth thin film transistor in the first electrostatic protection circuit connected to the light-emitting control signal line are turned on;
  wherein when both the third thin film transistor and the fourth thin film transistor are N-type thin film transistors, the scan line provides a high level first scan signal in the light emission preparation period, and in the light emitting period, the light-emitting control signal line provides a high level light-emitting control signal, under driving of which, the third thin film transistor and the fourth thin film transistor in the first electrostatic protection circuit connected to the light-emitting control signal line are turned on.

17. A display device, comprising a display panel, wherein the display panel comprises:
- a plurality of pixel circuits arranged in a display area of the display panel, wherein the plurality of pixel circuits is arranged in rows and columns, the display area comprises a first display area and a second display area arranged along a row direction, and an outer edge of the second display area extends stepwise along a column direction;
- a plurality of data lines each extending along the column direction, wherein the plurality of data lines corresponds to a plurality of columns of the plurality of pixel circuits in one-to-one correspondence;
- a plurality of signal line groups, wherein the plurality of signal line groups corresponds to a plurality of rows of the plurality of pixel circuits in one-to-one correspondence, and each of the plurality of signal line groups comprises a scan line and a light-emitting control signal line each extending along the row direction; and
- a plurality of first electrostatic protection circuits, wherein the plurality of first electrostatic protection circuits corresponds and is connected to the data lines in the second display area in one-to-one correspondence, each of the plurality of first electrostatic protection circuits is electrically connected to a scan line and a light-emitting control signal line of a same signal line group, and each of the plurality of first electrostatic protection circuits is used to discharge static electricity on a data line connected to the first electrostatic protection circuit to the scan line or the light-emitting control signal line connected to the first electrostatic protection circuit.

18. The display device according to claim 17, wherein each of the plurality of first electrostatic protection circuits includes a first thin film transistor, a first diode, and a second diode, wherein the first thin film transistor is of a same type as thin film transistors in the plurality of pixel circuits;
wherein a first electrode of the first diode is connected to a first electrode of the first thin film transistor and a second electrode of the first diode is connected to the corresponding scan line;

wherein a second electrode of the second diode is connected to both a second electrode of the first thin film transistor and the corresponding data line, and a first electrode of the second diode is connected to both a gate electrode of the first thin film transistor and the corresponding light-emitting control signal line.

19. The display device according to claim 17, wherein each first electrostatic protection circuit of the plurality of first electrostatic protection circuits comprises a second thin film transistor, a third diode, and a fourth diode, wherein the second thin film transistor is of a same type as thin film transistors in the plurality of pixel circuits;
wherein a first electrode of the third diode is connected to both a first electrode of the second thin film transistor and the corresponding data line, and a second electrode of the third diode is connected to the corresponding scan line; and
wherein a second electrode of the fourth diode is connected to a second electrode of the second thin film transistor, and a first electrode of the fourth diode is connected to both a gate electrode of the second thin film transistor and the corresponding light-emitting control signal line.

20. The display device according to claim 17, wherein each of the plurality of first electrostatic protection circuits comprises a third thin film transistor, a fourth thin film transistor, a fifth diode, and a sixth diode, wherein the third thin film transistor and the fourth thin film transistor are of a same type as thin film transistors in the plurality of pixel circuits;
a first electrode of the fifth diode is connected to a first electrode of the third thin film transistor, and a second electrode of the fifth diode is connected to the corresponding scan line;
wherein a second electrode of the third thin film transistor is connected to both the corresponding data line and a first electrode of the fourth thin film transistor;
wherein a second electrode of the sixth diode is connected to a second electrode of the fourth thin film transistor, and a first electrode of the sixth diode is connected to all of the corresponding light-emitting control signal line, a gate electrode of the third thin film transistor, and a gate electrode of the fourth thin film transistor.

* * * * *